(12) United States Patent
Stevens et al.

(10) Patent No.: US 7,859,276 B1
(45) Date of Patent: Dec. 28, 2010

(54) NON-DESTRUCTIVE VALIDATION OF SEMICONDUCTOR DEVICES

(75) Inventors: Rick C. Stevens, Apple Valley, MN (US); Nicholas K. Johnson, Minneapolis, MN (US); Andrew T. Fried, St. Paul, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 93 days.

(21) Appl. No.: 12/326,224

(22) Filed: Dec. 2, 2008

(51) Int. Cl.
*G01R 31/302* (2006.01)
*G01R 31/26* (2006.01)

(52) U.S. Cl. .................... 324/752; 324/765

(58) Field of Classification Search ............. 324/501, 324/750–752, 760, 765; 356/51, 311, 417
See application file for complete search history.

(56) References Cited

U.S. PATENT DOCUMENTS

| | | | |
|---|---|---|---|
| 3,803,413 A | | 4/1974 | Vanzetti et al. |
| 4,712,057 A | * | 12/1987 | Pau ............................ 250/310 |
| 6,541,987 B1 | * | 4/2003 | Bruce ........................ 324/752 |
| 6,840,667 B2 | | 1/2005 | Schlagheck et al. |
| 7,202,689 B2 | * | 4/2007 | Condon et al. ............... 324/763 |
| 7,777,507 B2 | * | 8/2010 | Bockelman et al. ......... 324/752 |
| 2002/0027941 A1 | | 3/2002 | Schlagheck et al. |
| 2007/0195320 A1 | * | 8/2007 | Sriram et al. ............... 356/301 |

OTHER PUBLICATIONS

Hefner et al. "A High-Speed Thermal Imaging System for Semiconductor Device Analysis." Semiconductor Thermal Measurement and Management, Seventeenth Annual IEEE Symposium, 2001, pp. 43-49.
Trigg. "Applications of Infrared Microscopy to IC and MEMS Packaging," IEEE Transactions on Electronics Packaging Manufacturing, vol. 26(3), Jul. 2003, pp. 232-238.

* cited by examiner

*Primary Examiner*—Ha Tran T Nguyen
*Assistant Examiner*—Joshua Benitez
(74) *Attorney, Agent, or Firm*—Hamre, Schumann, Mueller & Larson, P.C.

(57) ABSTRACT

A process for performing non-destructive monitoring of a semiconductor device that permits detection of additional circuitry that is not part of the original, intended design. This permits verification that additional circuitry, for example malicious circuitry, has not been added to the semiconductor device. In one embodiment, the monitoring is performed at the die level before the die is packaged into a complete semiconductor device. The monitoring is non-destructive so that the semiconductor die is not destroyed during the monitoring process.

22 Claims, 13 Drawing Sheets

NON-DESTRUCTIVE VALIDATION OF SEMICONDUCTOR DEVICES

FIELD

This disclosure relates to semiconductor devices and monitoring semiconductor devices to detect when additional circuitry is present that is not part of the original design.

BACKGROUND

A key concern regarding semiconductor devices and semiconductor development tools is the risk that malicious functions could be inserted into the semiconductor device. The threat of insertion of malicious functionality into semiconductor devices impacts many areas including military, government, and financial sectors. This threat is of particular concern when non-U.S. based semiconductor fabrication facilities and semiconductor development tools are used.

The ability to monitor a semiconductor device for malicious functionality so as to validate or authenticate the semiconductor device would be desirable.

SUMMARY

A process for performing non-destructive monitoring of a semiconductor device is described that permits detection of additional circuitry that is not part of the original, intended design. This permits verification that additional circuitry, for example malicious circuitry, has not been added to the semiconductor device. In one embodiment, the monitoring is performed at the die level before the die is packaged into a complete semiconductor device. The monitoring is non-destructive so that the semiconductor die is not destroyed during the monitoring process.

In one embodiment, a method of validating a semiconductor device includes electrically exercising the semiconductor device to be validated. Electromagnetic radiation, for example infrared radiation, emitted by the electrically exercised semiconductor device is then detected. An electromagnetic radiation signature based on the detected electromagnetic radiation is then generated, and compared with an expected electromagnetic radiation signature of a known valid semiconductor device that has been electrically exercised. By comparing the detected signature with the expected signature of the known or "golden" semiconductor device, a determination can be made as to whether or not additional circuitry has been added to the semiconductor device.

In another embodiment, a method of non-destructive semiconductor die monitoring includes electrically exercising at least one electric circuit on a semiconductor die to be monitored. Infrared radiation emitted by the electrically exercised electric circuit of the semiconductor die is then detected, and an infrared radiation signature for the electrically exercised electric circuit is generated based on the detected infrared radiation. The generated infrared radiation signature is then compared with an expected infrared radiation signature emitted by an identical, electrically exercised electric circuit on a master semiconductor die.

In one embodiment, all functional electric circuits of the semiconductor device are electrically exercised. The semiconductor device to be validated can be any semiconductor device, for example a fixed design such as an application-specific integrated circuit, or a programmable design such as a field-programmable gate array.

DRAWINGS

FIGS. 4A-D illustrate monitoring as applied to flip-flops on the semiconductor die.

Figure 5:
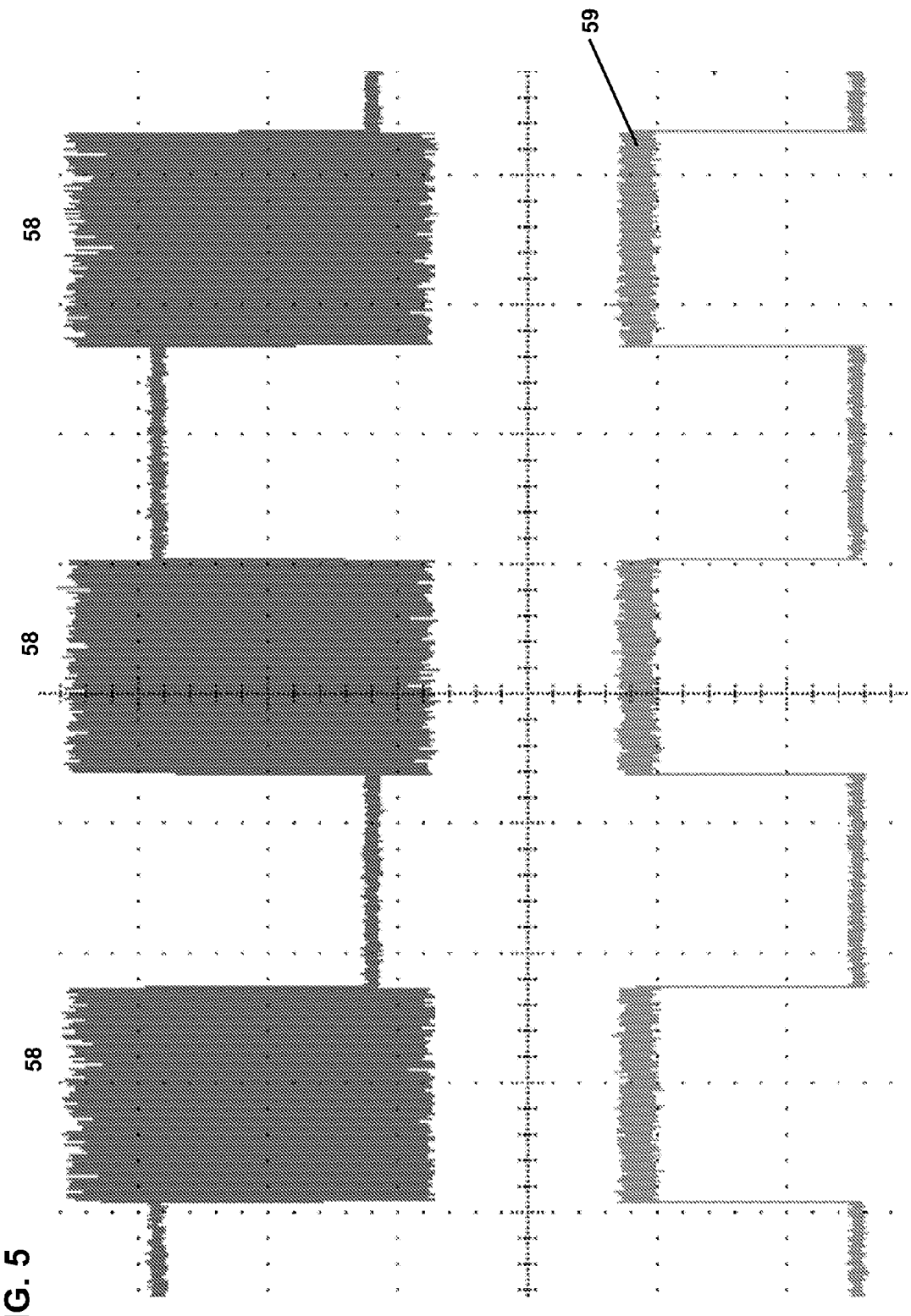

FIG. 5 illustrates high frequency switching of the flip-flops during monitoring.

Figure 6:
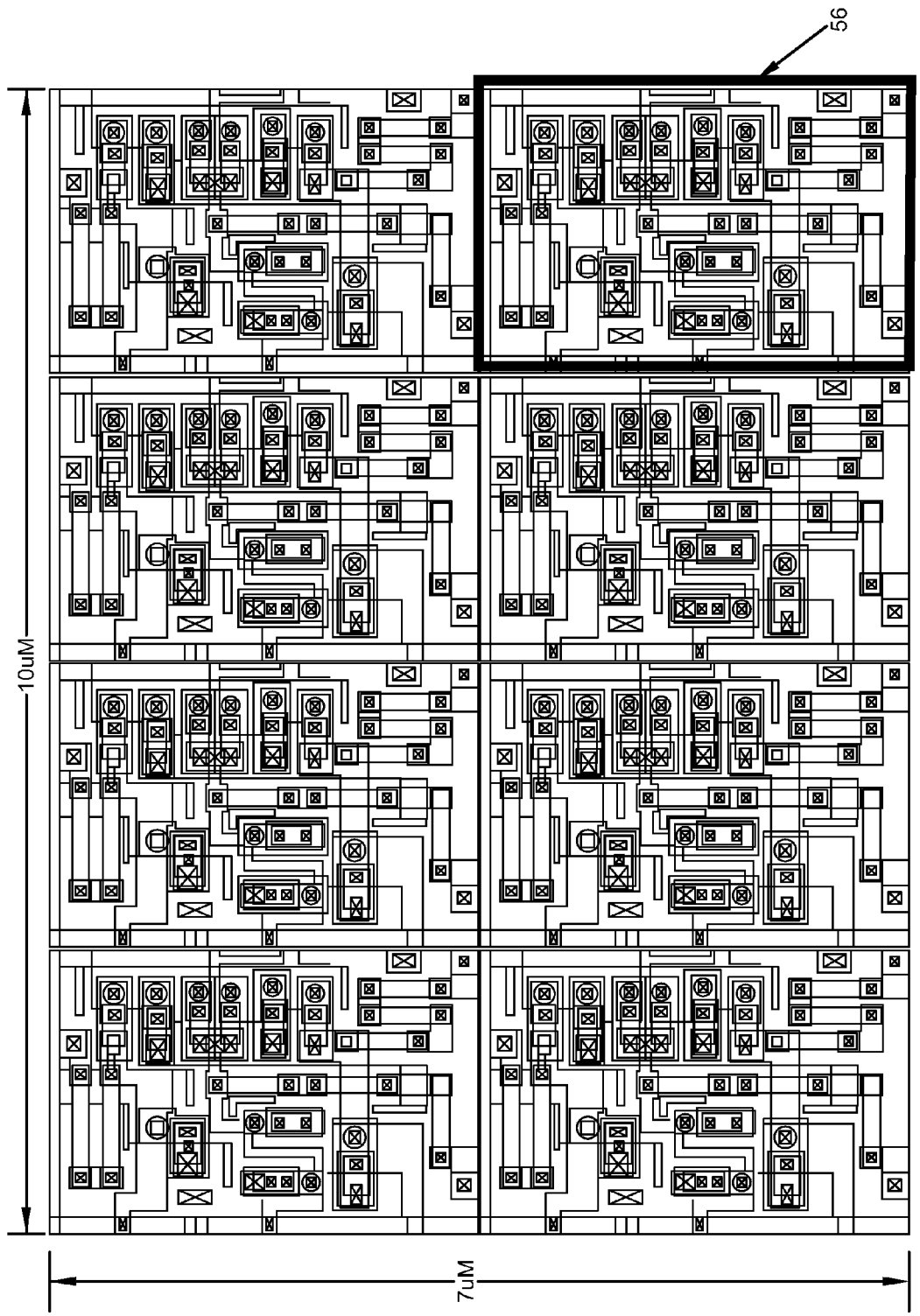

FIG. 6 illustrates the number of flip-flops that can be resolved with an 8-10 µm IR sensor.

Figure 7:
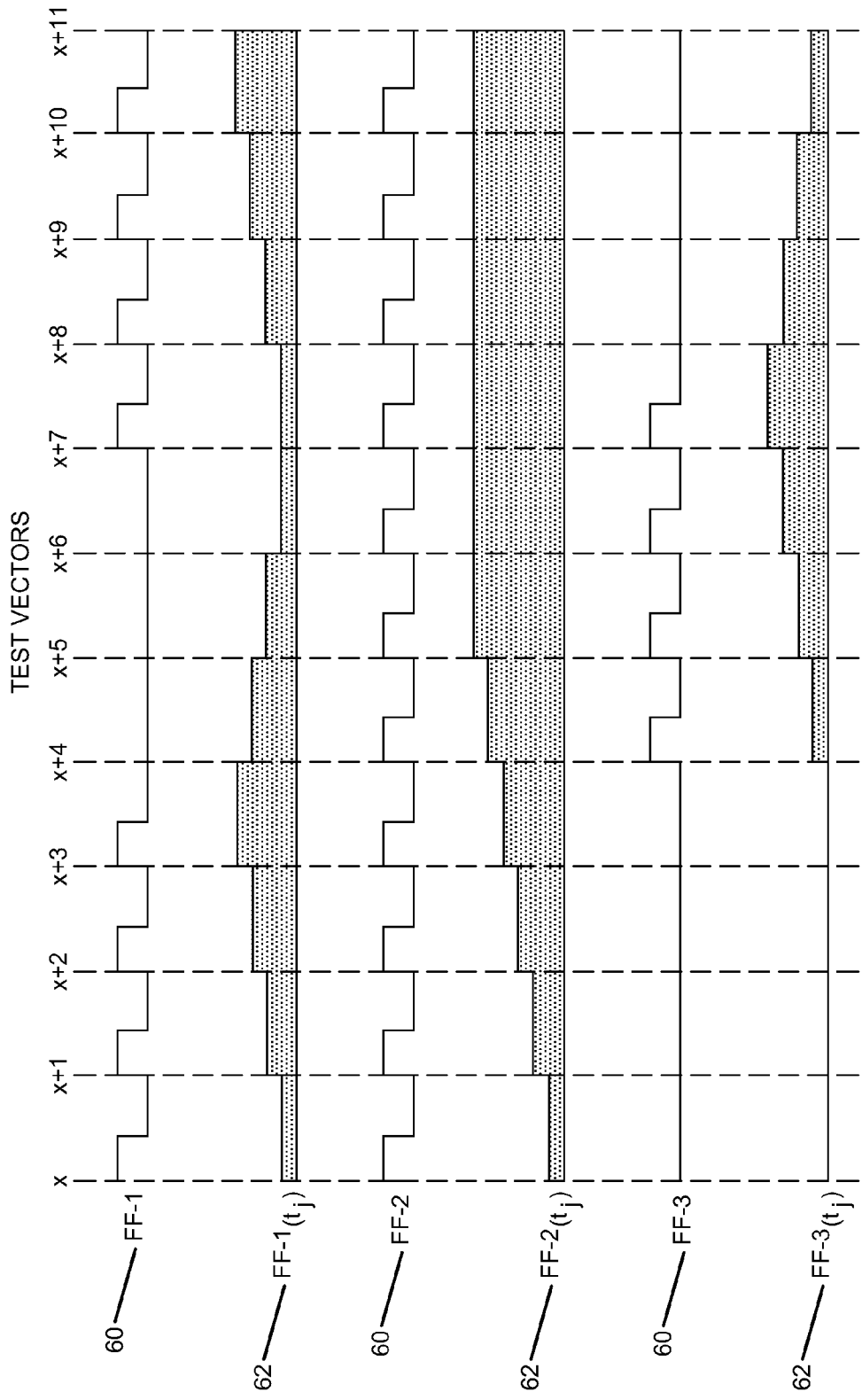

FIG. 7 illustrate vectors applied to flip-flops and their resulting thermal conditions.

Figure 8:
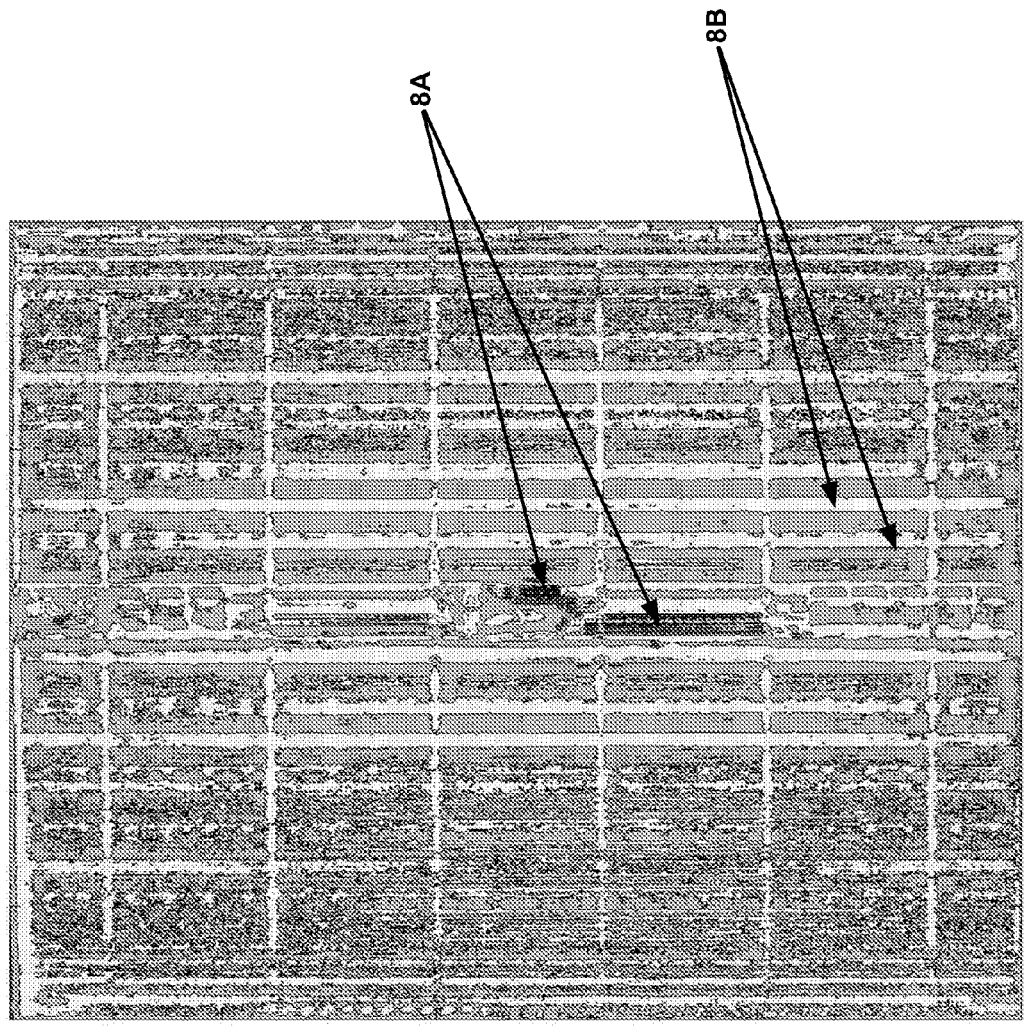

FIG. 8 illustrates an infra-red image of powered up FPGA semiconductor device with no excited flip-flops.

Figure 9:
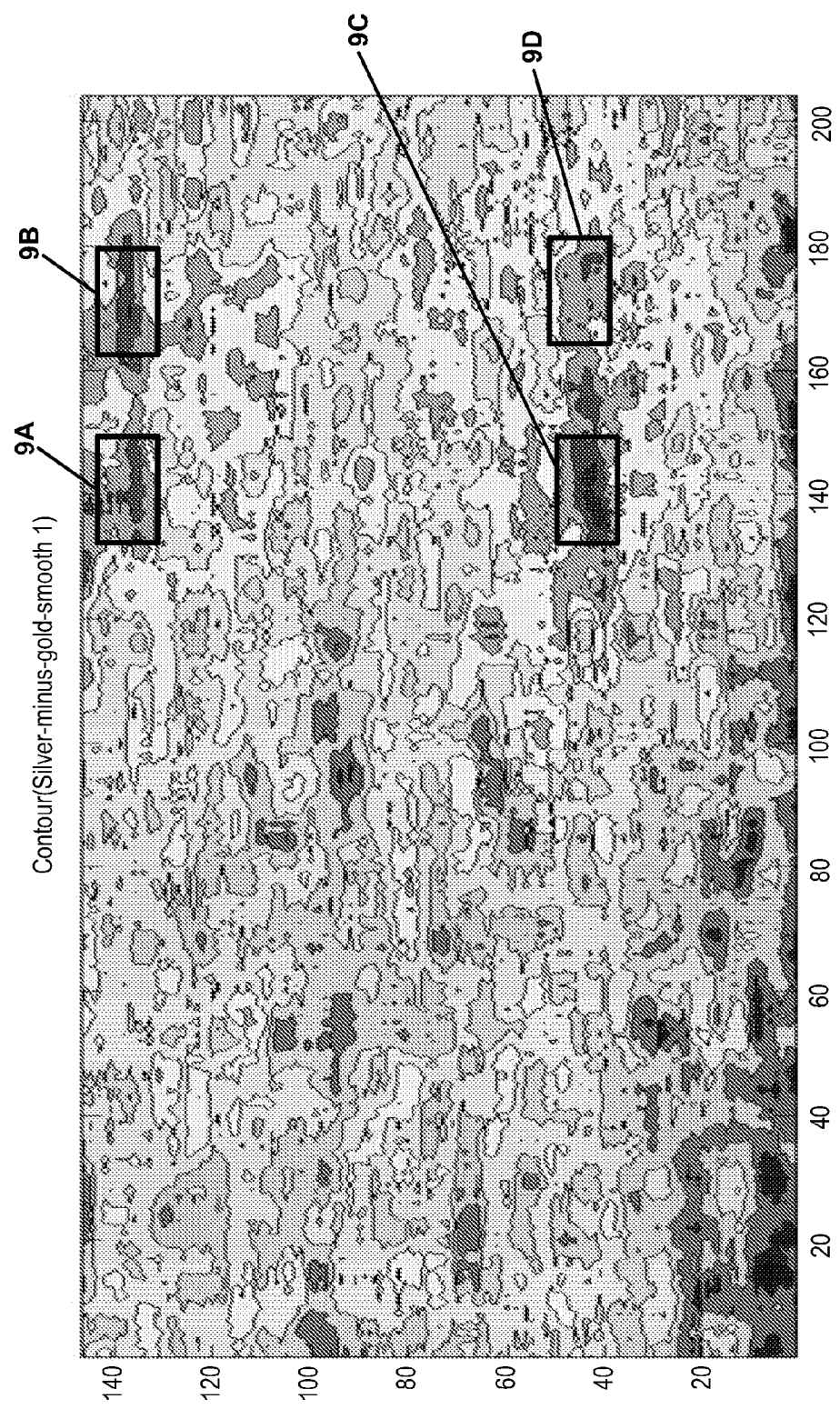

FIG. 9 illustrates an infra-red image of a powered up FPGA semiconductor device with excited flip-flops.

Figure 10A:
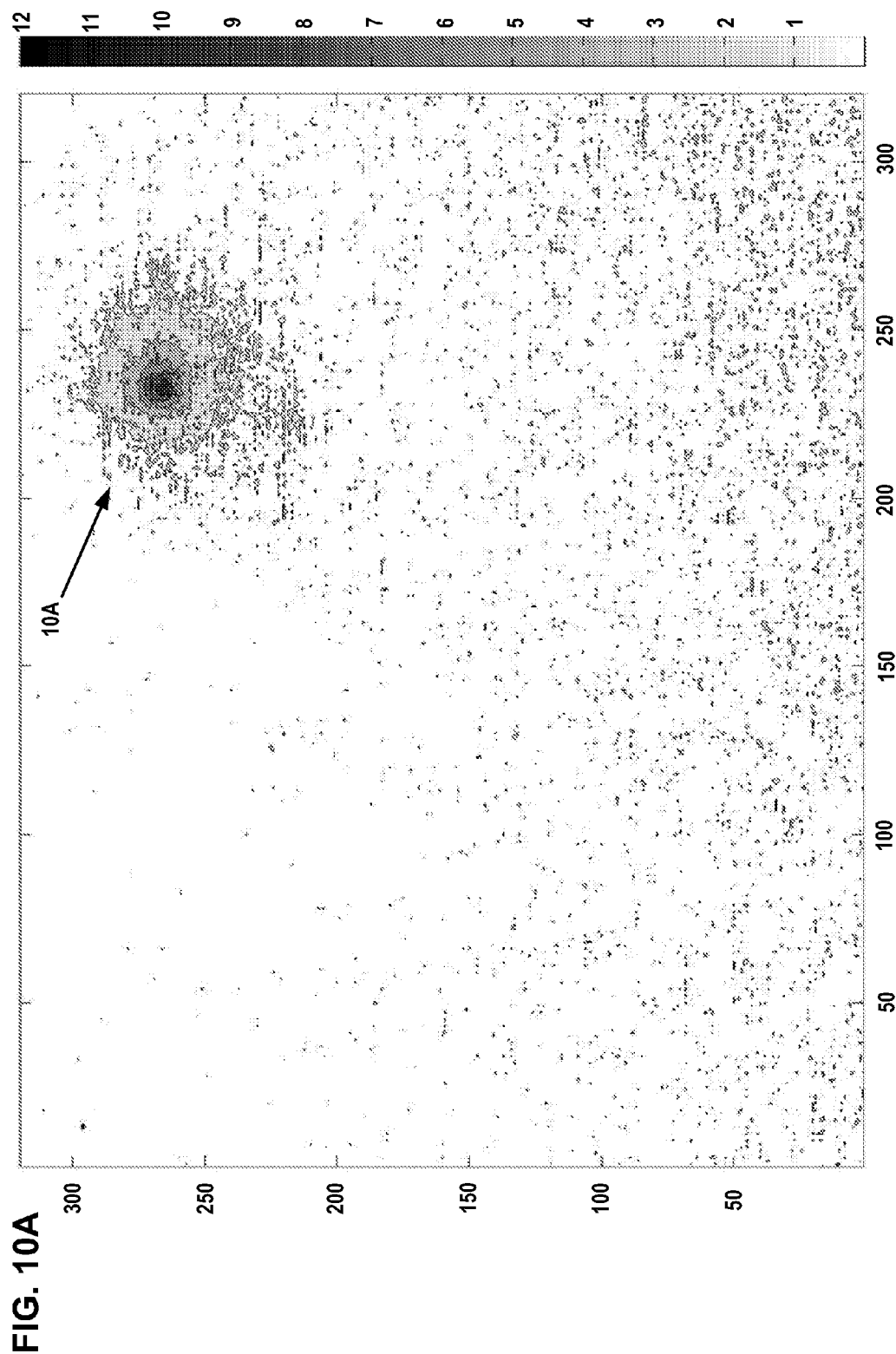

FIG. 10A illustrates a two-dimensional, post-processed infra-red image construction of a powered up FPGA semiconductor device with excited flip-flops.

Figure 10B:
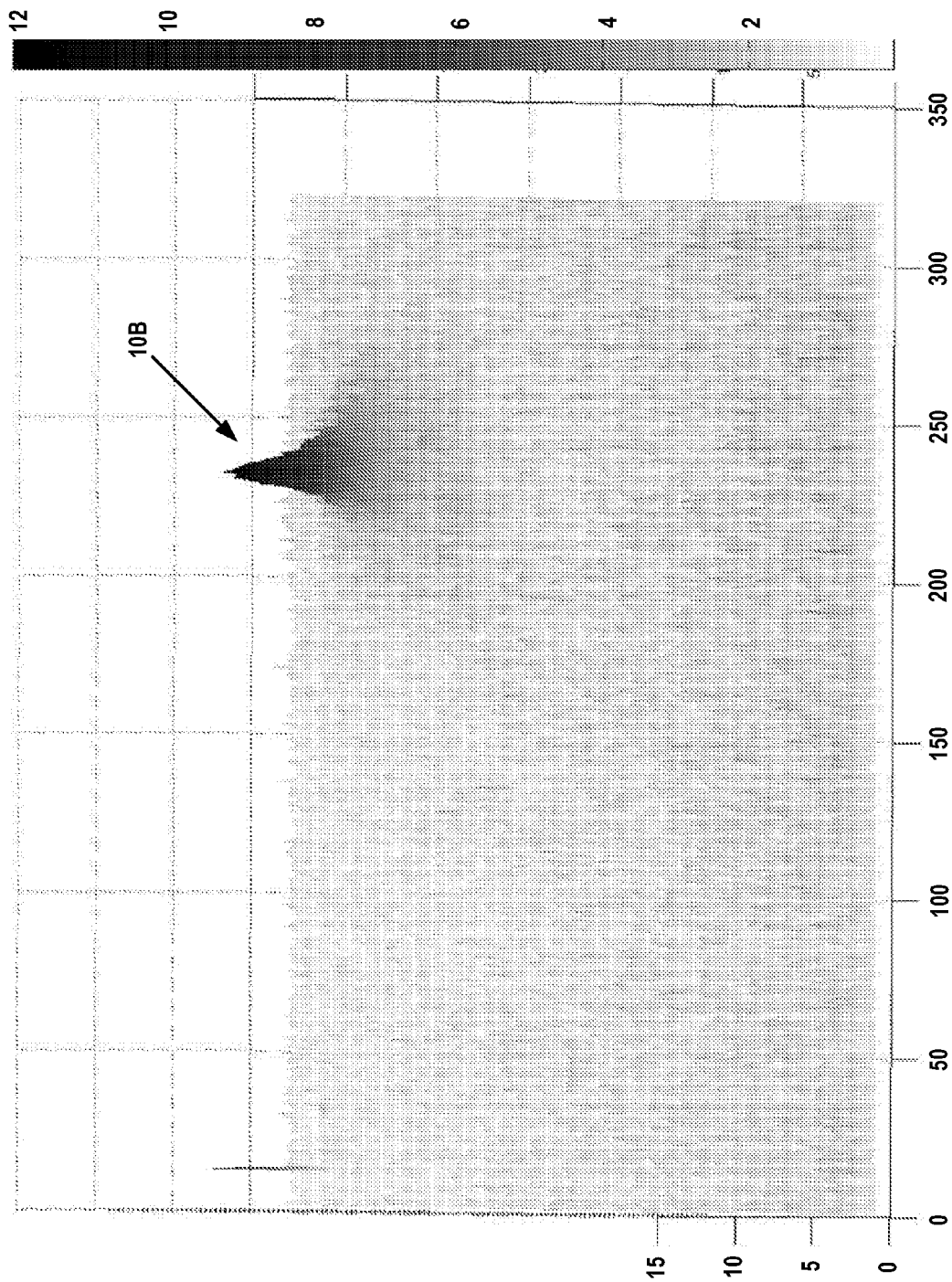

FIG. 10B illustrates a three-dimensional, post-processed infra-red image construction of a powered up FPGA semiconductor device with excited flip-flops.

DETAILED DESCRIPTION

Non-destructive monitoring of a semiconductor device is described that permits detection of additional electric circuitry that is not part of the original, intended design, which can also be referred to as a master design or a "golden" design. This permits verification that additional electric circuitry, for example malicious circuitry, has not been added to the semiconductor device. The monitoring is preferably performed at the die level before the die is packaged into a complete semiconductor device, Alternatively, the monitoring can be performed on a semiconductor device that has been decapsulated to produce the die to be monitored. The monitoring is non-destructive so that the semiconductor die is not destroyed during the monitoring process. The disclosed technique could also be applied to a die where direct access is not available as long as there is sufficient electromagnetic radiation to produce a detectable signature. Additionally, the technique could be applied to Printed Wiring Boards (PWBs) or a collection of components where malicious logic could be embedded.

Figure 1:
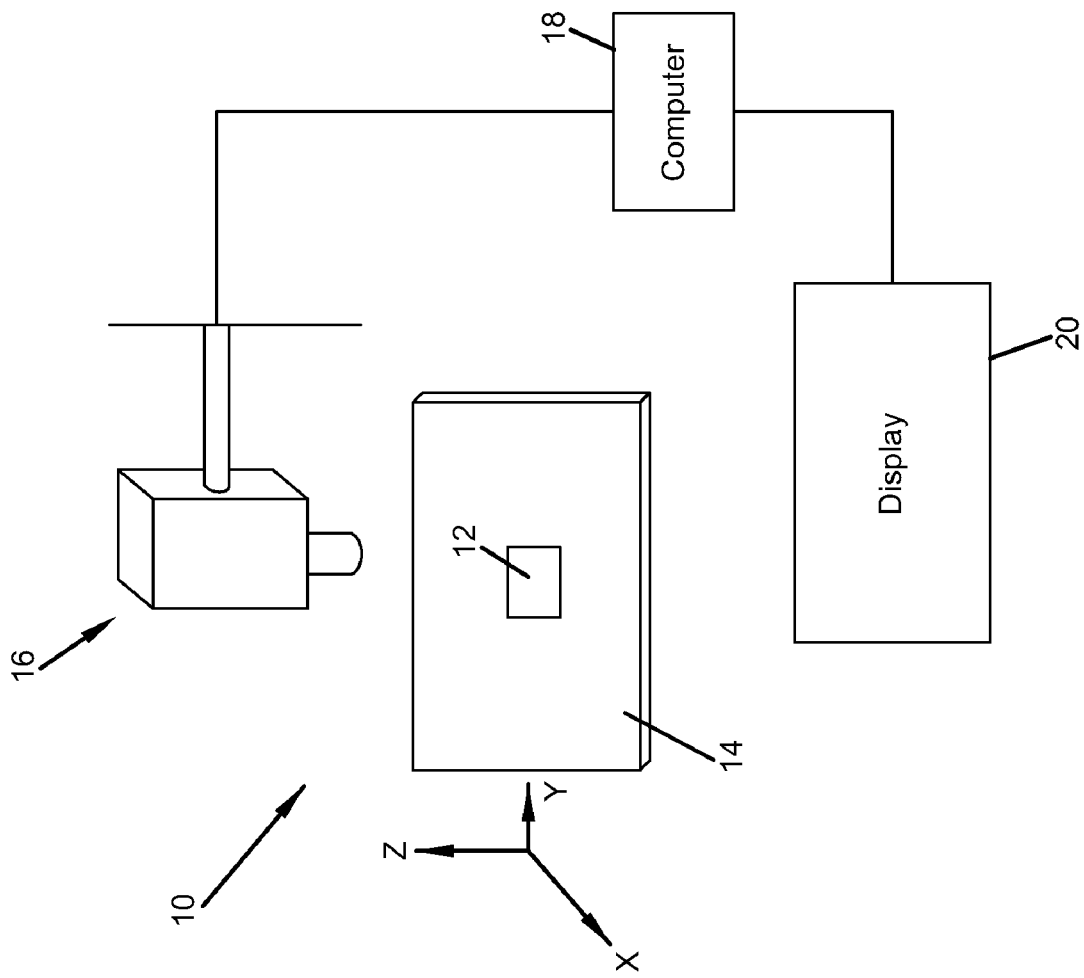
FIG. 1 illustrates a system for implementing non-destructive semiconductor die monitoring.

FIG. 1 illustrates a system 10 for implementing the non-destructive semiconductor die monitoring. A semiconductor die 12 to be monitored is mounted on an evaluation board 14 that is capable of electrically exercising/exciting the electric circuits on the semiconductor die. An electromagnetic radiation sensor 16, for example an infrared thermal imaging camera, is mounted above the evaluation board 14 for detecting electromagnetic radiation emitted by the electrically exercised semiconductor die when the electric circuits are electrically exercised. Signals from the sensor 16 are sent to a computer 18 which generates one or more electromagnetic radiation signatures based on the detected electromagnetic radiation. The computer 18 then compares the generated electromagnetic radiation signature(s) with corresponding expected electromagnetic radiation signature(s) of a known valid or master semiconductor die that has been electrically exercised. If desired, the generated radiation signature(s) can be displayed on a display device 20 such as a computer monitor.

The monitoring technique described herein requires a master semiconductor design known to be valid, and a library of master verification electromagnetic radiation signatures created from the master semiconductor design against which the generated electromagnetic radiation signature(s) will be compared. In one embodiment, each verification signature is an infrared radiation signature generated by an electric circuit on the master semiconductor design under predetermined electrical excitation by a test vector. The master semiconductor design can be a fixed design including, but not limited to, an application-specific integrated circuit (ASIC), or a programmable design including, but not limited to, a field-programmable gate array (FPGA).

In some circumstances, the described technique may also require die level access to a semiconductor device to be monitored. The monitoring can be done at the manufacturing level of the die before the die is packaged. However, if the die is packaged, monitoring can still be performed if the semiconductor device is decapsulated, for example by removing a copper heat spreader or other non-infrared transparent layers, to produce the die to be monitored.

Figure 2:
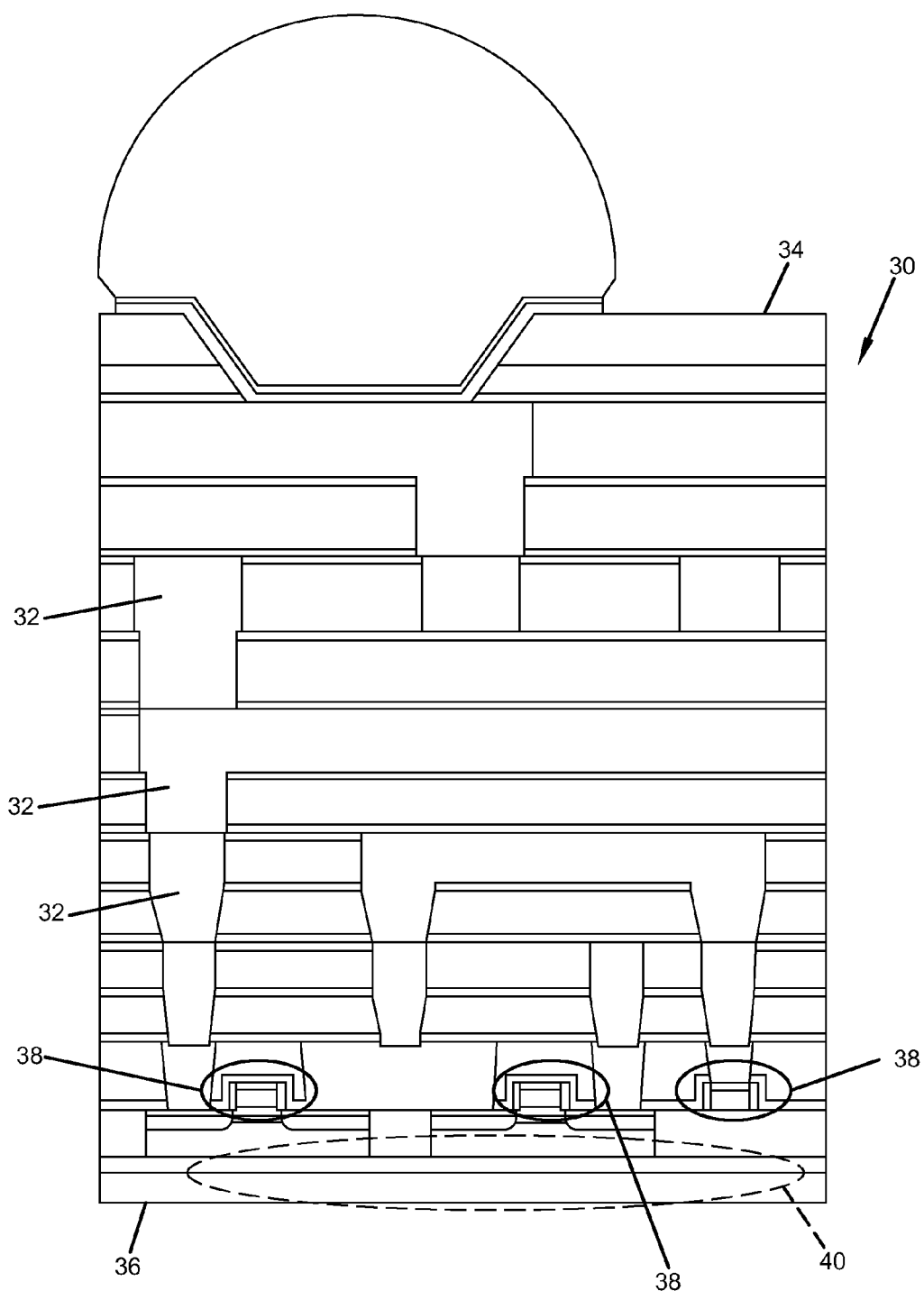
FIG. 2 illustrates a conventional semiconductor die.

A conventional semiconductor die 30 in the form of a complementary metal-oxide-semiconductor (CMOS) device that is suitable for monitoring using the disclosed technique is illustrated in FIG. 2. It is to be realized that the concepts described herein can be applied to other semiconductor devices as well. The CMOS device includes a plurality of metal layers 32, a top surface 34, and a bottom surface 36. Transistors 38 of the die 30 provide the maximum thermal density of the CMOS device, with the thermal path 40 for the transistors 38 being through the p-well and the buried $SiO_2$ to the p-silicon wafer.

The described monitoring technique monitors the thermal energy generated by connected transistors of the die 30 while being electrically exercised by a series of test vectors. The test vectors can be those that are typically developed and run during semiconductor die yield testing and are designed to electrically stimulate every functional electric circuit of the die 30. This is done to ensure that there are no bad logic or interconnect elements. These test vectors, when applied to a master or "golden" semiconductor die, will provide the library of master verification signatures that will provide the basis for subsequent die verification.

To create the master verification signatures, the test vectors are applied to the master die, and a corresponding thermal signature for each functional electric circuit is detected and stored. Those same test vectors are applied to a die to be monitored and the resulting thermal signatures compared with the master verification signatures. If the signatures are determined to match, the monitored die is considered to be valid. If the signatures are determined not to match, the monitored die is considered to be invalid and further investigation can be conducted.

Figure 3:
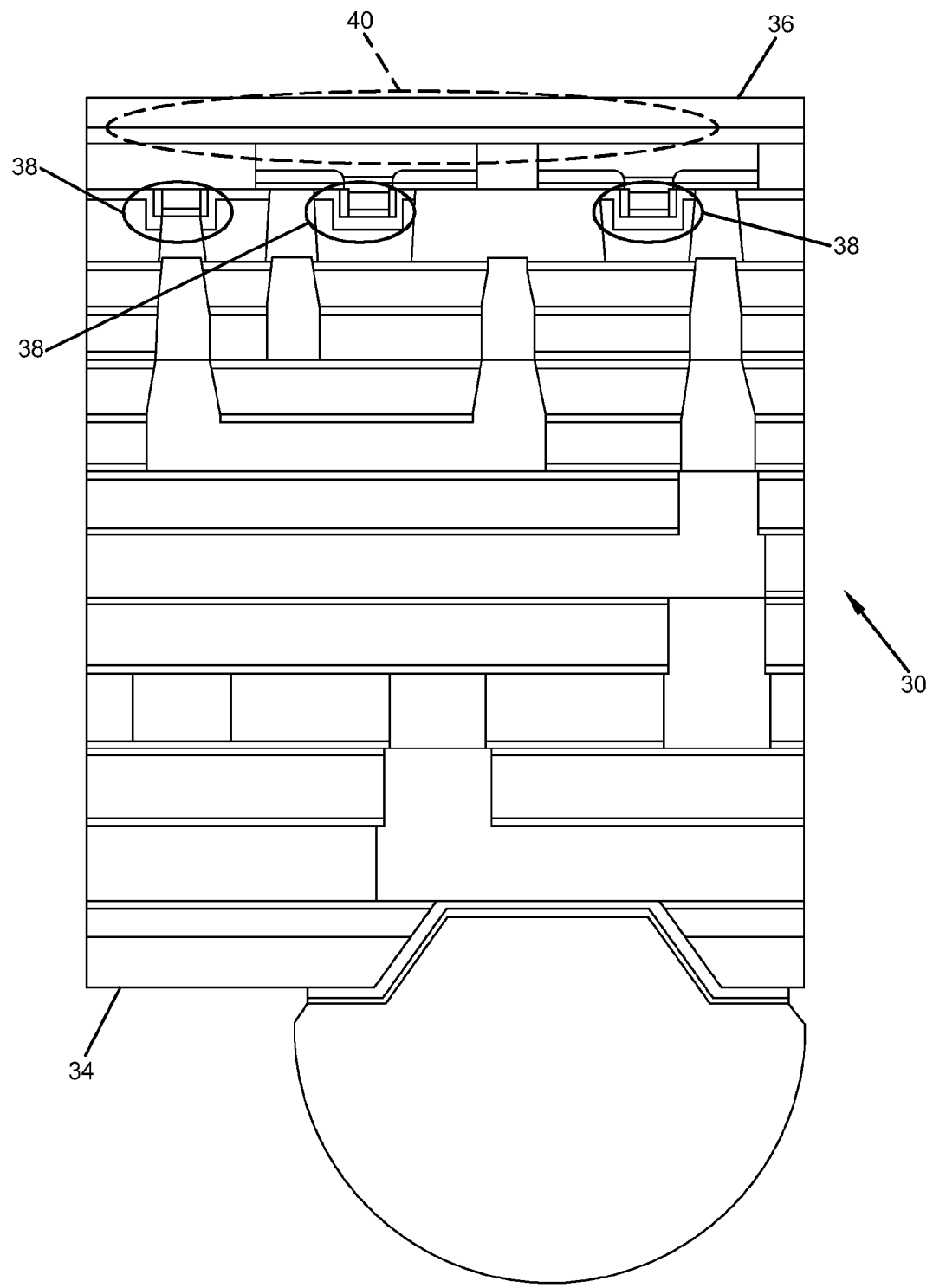
FIG. 3 illustrates the semiconductor die of FIG. 2 as oriented on an evaluation board during monitoring.

FIG. 3 illustrates the die 30 to be monitored as it would be mounted on the evaluation board 14 of FIG. 1. The die 30 is mounted up-side down, with the bottom surface 36 facing upward. The backside of the die 30 is imaged using a substrate penetrating infrared thermal imaging camera 16 during the application of the test vectors, with the detected infrared images then being compared to the master verification images. Since silicon is transparent at thermal infrared wavelengths, the thermal imaging camera 16 would be able to view through the transparent p-silicon wafer backside to the $CoSi_2$, copper and tungsten layers used to interconnect the transistors 38 to detect the thermal energy resulting from electrically exercising the various electric circuits of the die 30. It is these far-infrared opaque materials that will emit the characteristic black body radiation.

The test vectors need to be applied at a high frequency to minimize test time and to ensure comprehensive coverage. Therefore, a high-speed transient thermal imaging camera is needed. In addition, high speed imaging is necessary to measure the shape of small heat sources as found on a semiconductor die because the heat from these small sources rapidly diffuses to surrounding areas masking the original heat source shape and location. An example of a suitable thermal imaging camera that can be used is a FLIR SC8000 camera with a 1024×1024 focal plane array, $\lambda$=3-5 μm, and 12 μm pixel resolution. Other sensor devices capable of detecting infrared radiation or other electromagnetic radiation can be used. In some circumstances, it may be necessary to subsample the die in order to maximize the image sampling rate and resolution. This would require tiling across the die to achieve the same net effect.

An example of the disclosed technique applied to an FPGA and flip-flops on the FPGA will be discussed in detail. It is to be realized that the disclosed technique can be applied to other semiconductor devices and to other electric circuits such as logic gates and memory cells, PWB's, and other components where malicious logic could be embedded.

Figure 4A:
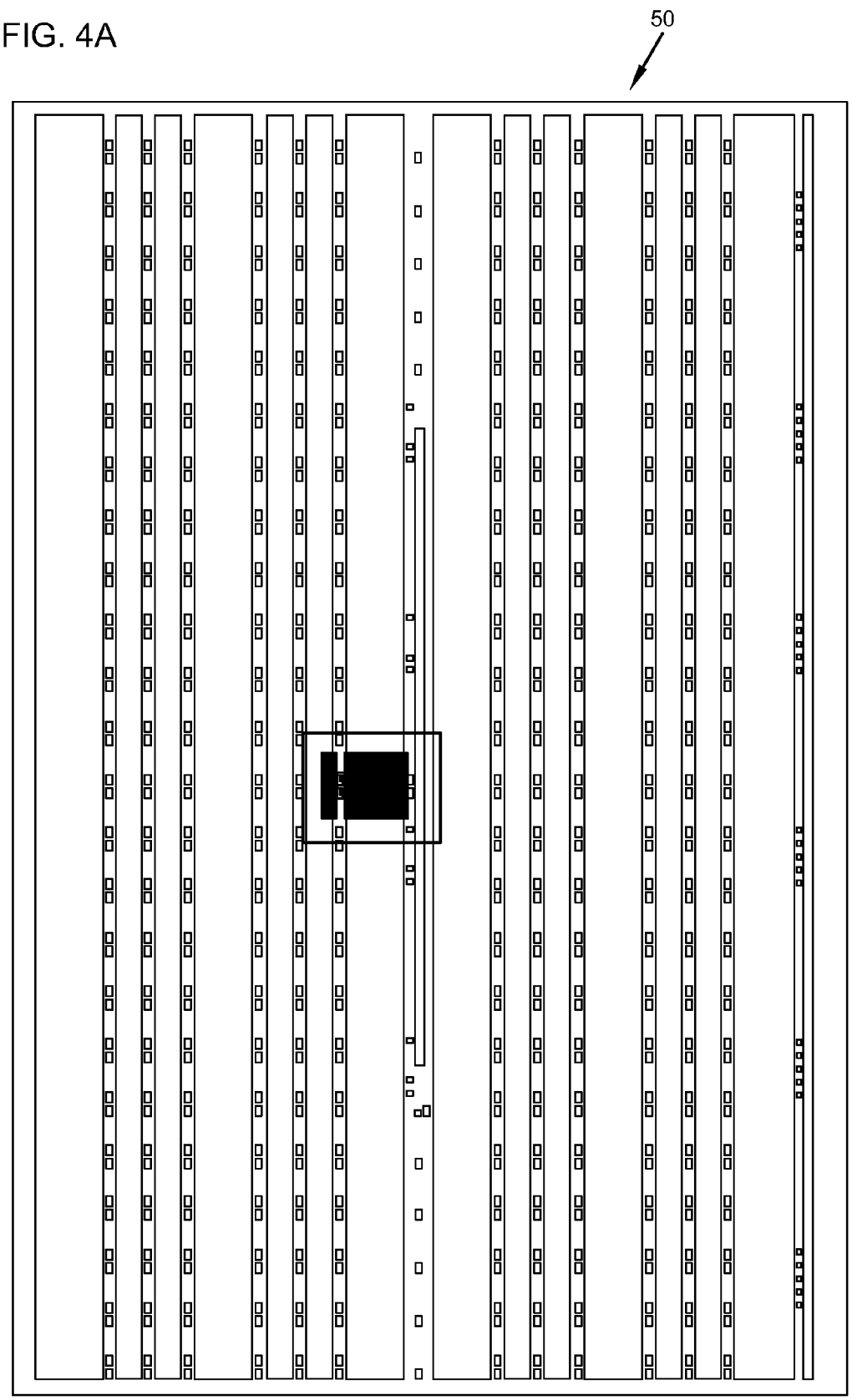
Figure 4B:
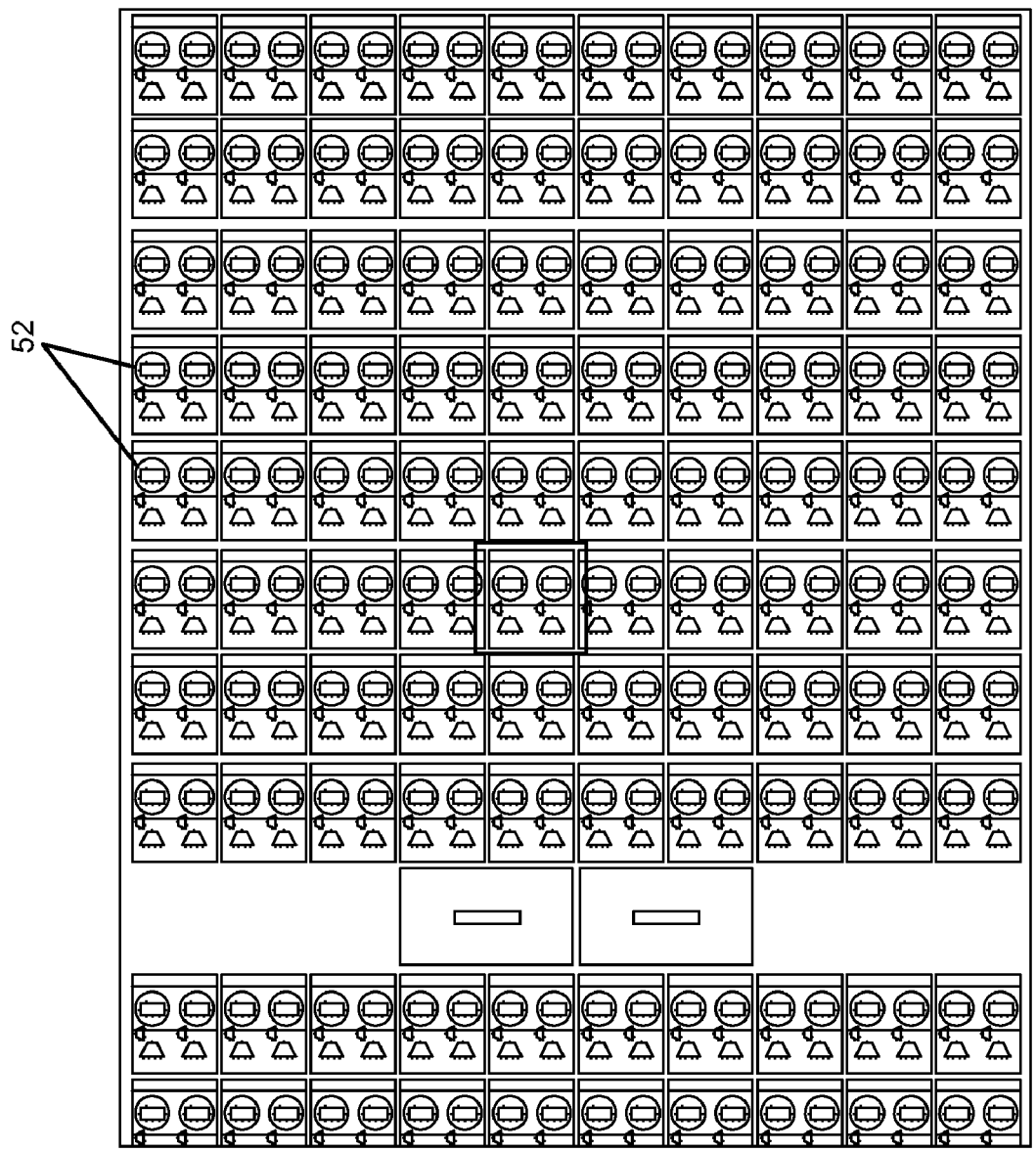
Figure 4C:
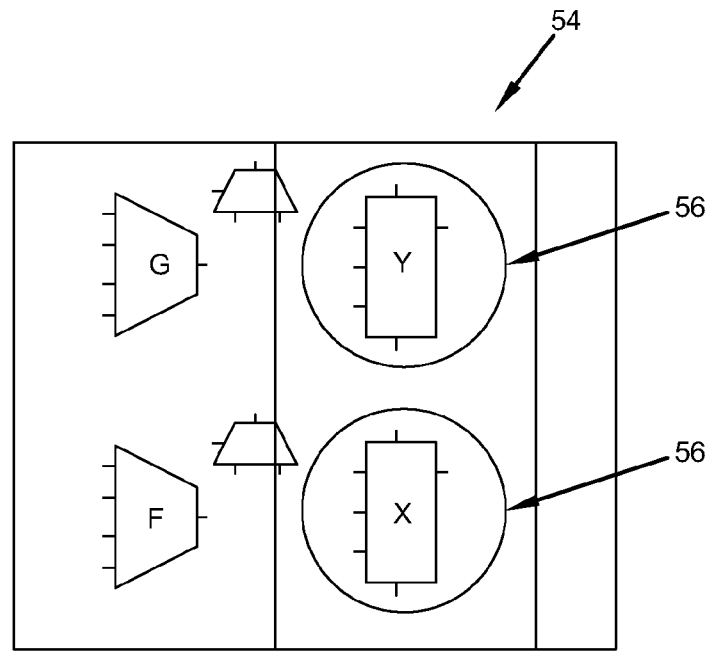
Figure 4D:
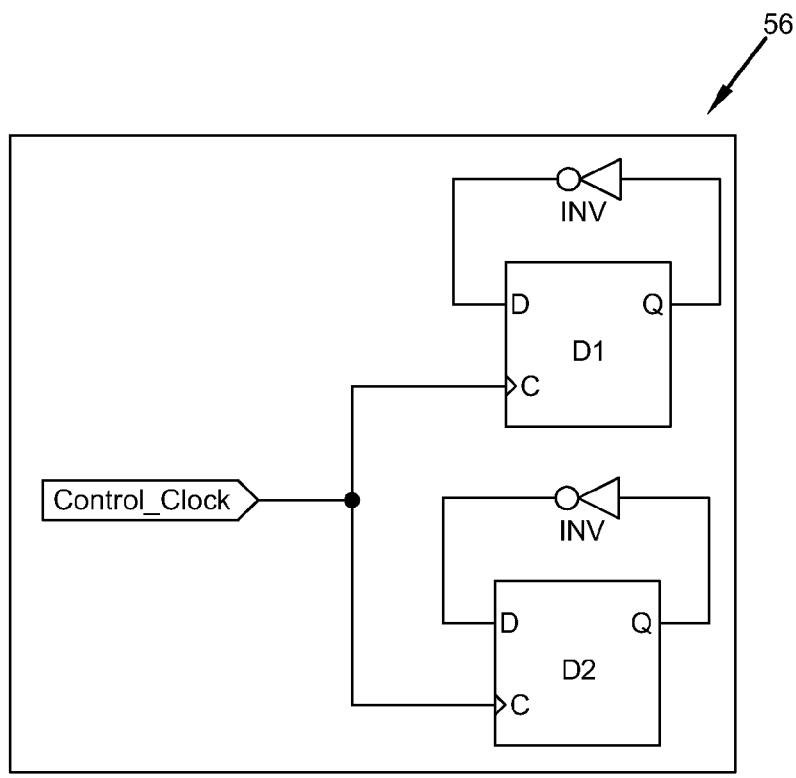

FIG. 4A illustrates an example of an FPGA die 50, while FIG. 4B illustrates a detailed view of groups 52 of activated logic in the boxed area indicated in FIG. 4A. FIG. 4C is a detailed view of the boxed area indicated in FIG. 4B of a logic block 54 containing D flip-flops 56, and FIG. 4D is an electrical schematic of the D flip-flops 56. When the flip-flops are electrically excited, the wavelength of black body radiation will not enable sufficient imaging resolution to resolve features at 90 nm or 65 nm transistor gate geometries with current technologies. However, with reference to FIG. 6, in the case of a typical D-type flip-flop 56, at 8-12 μm infrared wavelengths, it will be possible to consider resolution to blocks of 4-8 flip-flops depending on the use of subpixel resolution techniques. At this time, it is believed that a reasonable assumption regarding the amount of malicious functionality that would be added to a semiconductor design would be on the order of 10's of flip-flops, logic functions and memory cells.

To generate detectable heat patterns, the flip-flop blocks 54 are synchronously switched at high frequency 58, for example 100 MHz, on top of a low frequency 59, for example 100 Hz, as indicated in FIG. 5 using the evaluation board 14. Suitable timing and control circuitry enable the high frequency switching for selectable time periods. Active and deactive time periods provide periods of logic heating and cooling, respectively. However, the junction temperature will continue to increase until it reaches equilibrium based on the thermal resistance to ground. FIG. 7 illustrates exemplary test vectors 60 applied to three flip-flops FF-1, FF-2, FF-3, along with the resulting temperature profiles 62 of the flip-flops. If the malicious logic is dispersed across the die it may be necessary to adjust the logic activation and deactivation time to enable greater thermal diffusion to ensure detection.

In one example, the die 30 is tested using 1 billion test vectors using a tester capable of applying vectors at a rate of 100 Mhz, for a total tester time of 10 seconds. The thermal images can be collected at a rate of 500 Hz, resulting in 5,000 thermal images. Each set of thermal images, assuming that the die size is 143 $mm^2$ (the Core 2 Extreme Intel die at 65 nm), would consist of 300 million entries to achieve an approximate 64 square μm resolution. If thermal persistence is necessary to ensure effective thermal imaging, the test vector application rate can be decreased.

To apply the necessary high-speed synchronized test vectors and thermal imaging, the system 10 needs to provide control of the evaluation board 14 temperature, acquisition of the camera 16 voltage waveforms from a digitizing oscilloscope, x and y movements of the evaluation board 14 to allow the camera 16 to capture thermal images over the entire area of the die (alternatively, the camera can be moved in the x and y directions relative to the evaluation board), and calculation of the temperature detected by the camera 16 voltage at each time and position. If necessary, the evaluation board 14 or the camera 16 can also be constructed to move in the z direction to bring the die and camera closer together, and the board 14 or camera 16 can be constructed to enable tilting about the x-axis and/or the y-axis. Another optional implementation would be to use multiple fixed cameras to collect images, eliminating the need for x,y,z movements.

FIG. 8 illustrates an infra-red image of an FPGA semiconductor device that is powered but has no excited flip-flops. It can be seen that there is a steady state infra-red image that is a result of clock drivers, internal buffers, JTAG logic, etc. indicated by reference 8A, and interconnect routing channels indicated by reference 8B.

FIG. 9 illustrates an infra-red image of an FPGA semiconductor device that is powered and has four areas of active flip-flops 9A-9D.

FIGS. 10A and 10B illustrate post processed infra-red image constructions of an FPGA semiconductor device that is powered and has only one area of active flip-flops. This area can clearly be seen in the two-dimensional image construction 10A of FIG. 10A and in the three-dimensional image construction 10B of FIG. 10B. The background steady state clutter was processed out by using the frequency component of the images to perform filtering. A spatial derivative or filtering of the spectral information is used to derive the center point or area of actual logic activation. For example, an example of an algorithmic approach is to remove 0 Hz (ambient temperature) of every pixel, compute the fast Fourier transform (FFT) of every pixel, calculate the maximum FFT of every pixel, remove single-pixel non-uniformities, locate extrema after non-uniformities are removed and index the frequency, and recall all pixel FFT data at that frequency. In addition, space, time and frequency components of the electromagnetic radiation can be used to create improved images for greater feature resolution. Thus, the algorithmic characterization of the electromagnetic radiation signature is a function of space, time, and frequency.

The thermal image data can be processed in a number of ways to facilitate comparison with the master verification signatures. For example, n-D FFT algorithms can be applied. Ideally, the processing applied to the thermal image data matches any processing that was applied to create the master verification signatures. Techniques for collecting, processing and comparing thermal images with stored thermal images are known in the art. For example, see U.S. Pat. No. 6,840,667 and U.S. 2002/0027941. The comparison with the master verification signatures can include any computational modifications to the detected signatures in order to eliminate false detections of undesired logic.

The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A method of validating a semiconductor device, comprising:
   electrically exercising a semiconductor device to be validated without irradiating said semiconductor device with a radiation source;
   detecting electromagnetic radiation emitted by the electrically exercised semiconductor device as a result of said electrical exercise of said semiconductor device;
   generating an electromagnetic radiation signature based on the detected electromagnetic radiation;
   characterizing the generated electromagnetic radiation signature as a function of space, time and frequency; and
   comparing the generated electromagnetic radiation signature with an expected electromagnetic radiation signature of a known valid semiconductor device that has been electrically exercised.

2. The method of claim 1, wherein electrically exercising the semiconductor device comprises electrically exercising an electric circuit of the semiconductor device; and detecting electromagnetic radiation emitted by the exercised electric circuit, generating the electromagnetic radiation signature based on the detected electromagnetic radiation from the exercised electric circuit, and comparing the generated electromagnetic radiation signature with the expected electromagnetic radiation signature of an identical, electrically exercised electric circuit of the known valid semiconductor device.

3. The method of claim 2, wherein a spatial derivative or filtering of the generated electromagnetic radiation signature is used to derive a center point or area of actual electric circuit activation.

4. The method of claim 2, wherein the electric circuit comprises a flip-flop, a logic gate or a memory cell.

5. The method of claim 1, comprising electrically exercising a plurality of electric circuits of the semiconductor device; and detecting electromagnetic radiation emitted by the plurality of exercised electric circuits, generating an electromagnetic radiation signature based on the detected electromagnetic radiation for each of the exercised electric circuits, and comparing each generated electromagnetic radiation signature with expected electromagnetic radiation signatures of identical, electrically exercised electric circuits of the known valid semiconductor device.

6. The method of claim 1, comprising electrically exercising all functional electric circuits of the semiconductor device; and detecting electromagnetic radiation emitted by all of the exercised electric circuits, generating an electromagnetic radiation signature based on the detected electromagnetic radiation for each of the exercised electric circuits, and comparing each generated electromagnetic radiation signature with expected electromagnetic radiation signatures of identical, electrically exercised electric circuits of the known valid semiconductor device.

7. The method of claim 1, wherein detecting electromagnetic radiation comprises using an infrared camera to detect infrared radiation emitted by the electrically exercised semiconductor device.

8. The method of claim 7, wherein characterizing the generated electromagnetic radiation signature as a function of space, time and frequency comprises collecting images from the infrared camera by moving the camera and the semiconductor device relative to each other in x, y and z directions.

9. The method of claim 1, wherein the semiconductor device to be validated is a semiconductor device die.

10. The method of claim 1, wherein the semiconductor device to be validated comprises a fixed design or a programmable design.

11. The method of claim 1, wherein the semiconductor device to be validated comprises an application-specific integrated circuit or a field-programmable gate array.

12. The method of claim 1, wherein comparing includes computational modifications to the generated electromagnetic radiation signature in order to eliminate false detections.

13. The method of claim 1 further comprising, based on the comparison, determining whether one or more additional circuits are present in said semiconductor device in view of the known valid semiconductor device.

14. The method of claim 1, wherein characterizing the generated electromagnetic radiation signature as a function of space, time and frequency comprises applying electrical excitation at a first frequency and at a second frequency lower than the first frequency.

15. A method of non-destructive semiconductor die monitoring, comprising:
   electrically exercising at least one electric circuit on a semiconductor die to be monitored without irradiating said at least one electric circuit with a radiation source;
   detecting infrared radiation emitted by the electrically exercised electric circuit of the semiconductor die as a result of said electrical exercise of said at least one electric circuit;
   generating an infrared radiation signature for the electrically exercised electric circuit based on the detected infrared radiation;
   comparing the generated infrared radiation signature with an expected infrared radiation signature emitted by an identical, electrically exercised electric circuit on a master semiconductor die; and
   based on the comparison, determining whether said at least one electric circuit includes or is an additional circuit in said semiconductor die in view of the master semiconductor die.

16. The method of claim 15, comprising electrically exercising a plurality of electric circuits of the semiconductor die; and detecting infrared radiation emitted by the plurality of exercised electric circuits, generating an infrared radiation signature for each of the electrically exercised electric circuits, and comparing each generated infrared radiation signature with expected infrared radiation signatures of identical, electrically exercised electric circuits on the master semiconductor die.

17. The method of claim 15, comprising electrically exercising all functional electric circuits of the semiconductor die; and detecting infrared radiation emitted by all of the exercised electric circuits, generating an infrared radiation signature for each of the exercised electric circuits, and comparing each generated infrared radiation signature with expected infrared radiation signatures of identical, electrically exercised electric circuits on the master semiconductor die.

18. The method of claim 15, wherein detecting infrared radiation comprises using a thermal imaging camera.

19. The method of claim 15, wherein the semiconductor die comprises a fixed design or a programmable design.

20. The method of claim 15, wherein the semiconductor die comprises an application-specific integrated circuit or a field-programmable gate array.

21. The method of claim 15, wherein the electric circuit comprises a flip-flop, a logic gate or a memory cell.

22. The method of claim 15 further comprising characterizing the generated infrared radiation signature as a function of space, time, and frequency.

* * * * *